（12） United States Patent
Meyer

(10) Patent No.: US 10,809,336 B2
(45) Date of Patent: Oct. 20, 2020

(54) ADAPTING A PARAMETER OF A PARAMETER SET FOR A MAGNETIC RESONANCE MEASUREMENT

(71) Applicant: Siemens Healthcare GmbH, Erlangen (DE)

(72) Inventor: Stefan Meyer, Langensendelbach (DE)

(73) Assignee: SIEMENS HEALTHCARE GMBH, Eerlangen (DE)

( * ) Notice: Subject to any disclaimer, the term of this patent is extended or adjusted under 35 U.S.C. 154(b) by 228 days.

(21) Appl. No.: 15/985,874

(22) Filed: May 22, 2018

(65) Prior Publication Data
US 2018/0340996 A1    Nov. 29, 2018

(30) Foreign Application Priority Data
May 24, 2017   (DE) ........................ 10 2017 208 813

(51) Int. Cl.
*G01R 33/54*    (2006.01)
*G01R 33/28*    (2006.01)

(52) U.S. Cl.
CPC ......... *G01R 33/546* (2013.01); *G01R 33/288* (2013.01); *G01R 33/543* (2013.01)

(58) Field of Classification Search
CPC ... G01R 33/288; G01R 33/543; G01R 33/546
See application file for complete search history.

(56) References Cited

U.S. PATENT DOCUMENTS 5,798,643 A * 8/1998 Werthner ............. G01R 33/482
324/309
10,241,161 B2 * 3/2019 Kaneko .................. A61B 5/748
(Continued)

FOREIGN PATENT DOCUMENTS

DE    102009038139 A1    2/2011

OTHER PUBLICATIONS

IEC 60601-2-33, "Medical electrical equipment—2-33: Particular requirements for the safety of magnetic resonance equipment for medical diagnosis," 2010.
(Continued)

*Primary Examiner* — Dixomara Vargas
(74) *Attorney, Agent, or Firm* — Harness, Dickey & Pierce, P.L.C.

(57) ABSTRACT

A method is for adapting a parameter of a parameter set for a magnetic resonance measurement of an examination object. An embodiment of the method includes choosing a parameter set required for the magnetic resonance measurement of the examination object; determining at least one interaction indicator applicable to an interaction between electromagnetic radiation and a tissue of the examination object; comparing the interaction indicator with a previously defined upper limit for the interaction indicator and, upon the upper limit being exceeded, determining a group of parameters from the parameter set, adaptable with a view to complying with the upper limit. The method further includes calculating a modification suggestion for a multiplicity of parameters from the group with a view to complying with the upper limit, identifying a parameter to optimize a quality parameter of the magnetic resonance measurement, and adapting the identified parameter in accordance with its modification suggestion.

20 Claims, 2 Drawing Sheets

(56) References Cited

U.S. PATENT DOCUMENTS

| | | | | |
|---|---|---|---|---|
| 10,444,305 B2 * | 10/2019 | Tomiha | ............... | G01R 33/58 |
| 2008/0182524 A1 * | 7/2008 | Graesslin | ........... | G01R 33/3415 |
| | | | | 455/73 |
| 2010/0244840 A1 * | 9/2010 | McKinnon | ........... | G01R 33/288 |
| | | | | 324/322 |
| 2011/0043204 A1 | 2/2011 | Bielmeier et al. | | |
| 2016/0299202 A1 * | 10/2016 | Sakuragi | .............. | G01R 33/288 |

OTHER PUBLICATIONS

German Office Action for Application No. 10 2017 208 813.3 dated Feb. 6, 2018.

\* cited by examiner

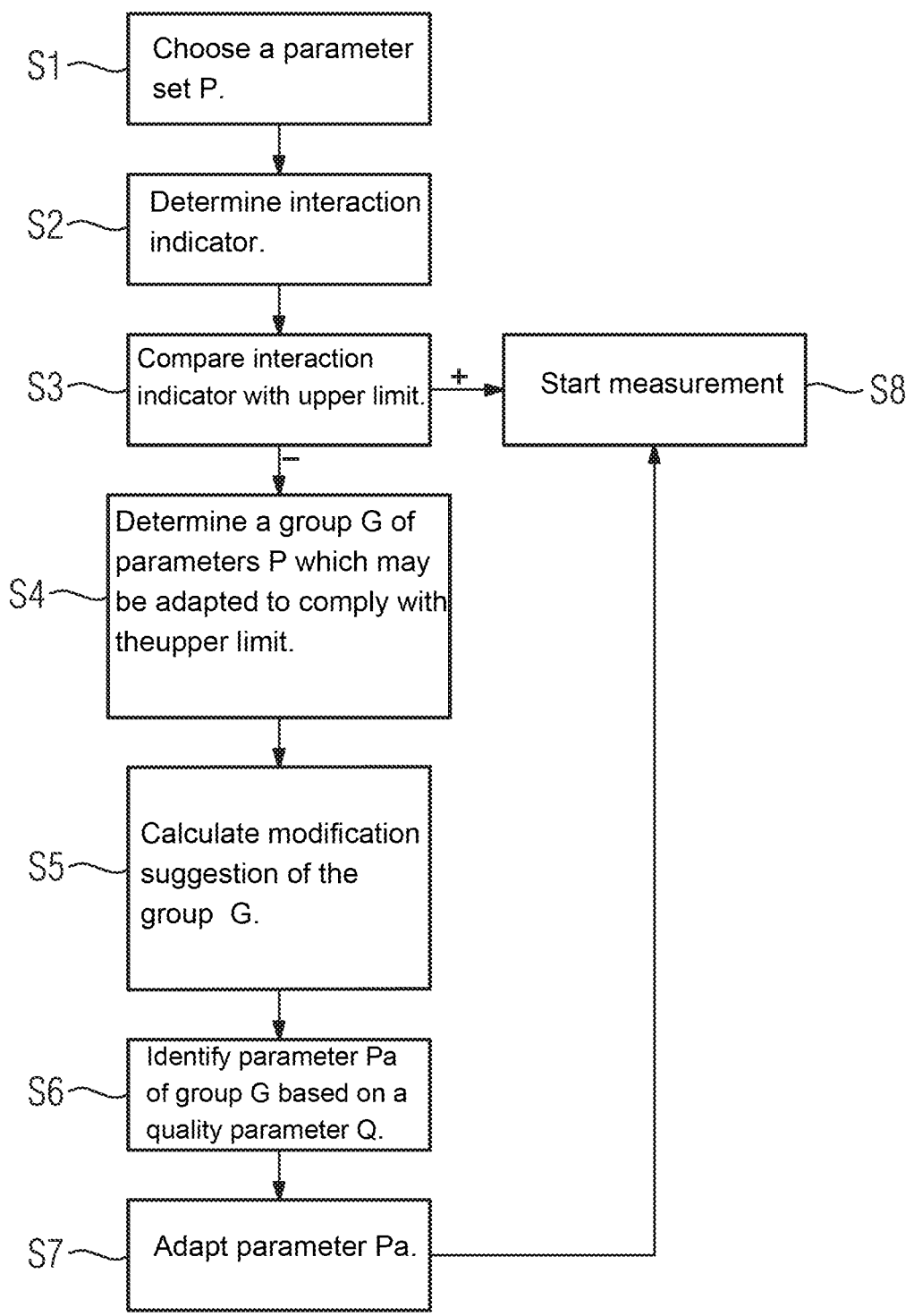

ADAPTING A PARAMETER OF A PARAMETER SET FOR A MAGNETIC RESONANCE MEASUREMENT

PRIORITY STATEMENT

The present application hereby claims priority under 35 U.S.C. § 119 to German patent application number DE 102017208813.3 filed May 24, 2017, the entire contents of which are hereby incorporated herein by reference.

FIELD

At least one embodiment of the invention generally relates to a method for adapting a parameter of a parameter set for a magnetic resonance measurement in a manner which monitors an interaction indicator, a computing unit, a magnetic resonance installation, a computer program and/or a computer-readable data medium.

BACKGROUND

Magnetic resonance measurements today are subject to strict safety rules in order to protect the patient. For example, a magnetic resonance measurement is only allowed to cause a specified value for a specific absorption rate (SAR) in the patient. In addition, a measurement is only allowed to cause a specified value for a tissue stimulation (STIM). Permissible SAR and STIM values are defined in IEC 60601-2-33, "Medical electrical equipment—2-33: Particular requirements for the safety of magnetic resonance equipment for medical diagnosis". It is therefore possible today to refer to the underlying measurement parameters for each magnetic resonance measurement, in order to calculate the specific absorption rate and/or a stimulation caused by the measurement before the measurement is performed.

If the determined values lie within permissible limits, the measurement can be started immediately. However, if one of the determined values exceeds the applicable limit value, the chosen set of measurement parameters must be so adapted as to comply with the SAR and/or STIM limit value.

In order to achieve this, it is normal practice to calculate suggestions for the user to modify the parameter set that has been chosen according to a desired measurement protocol at the magnetic resonance installation, with a view to complying with the limit values, and to display the suggestions for selection by the user. The user can then select a measurement parameter and adapt it according to the suggestion. The measurement then takes place using the adapted parameter set.

SUMMARY

The inventor has discovered that this approach is problematic in that the manual selection of one of the suggestions for the parameter modification hinders the user in their workflow, since they already approved the measurement at the outset when inputting the measurement protocol. In the case of contrast medium examinations in particular, in which the exact timing between contrast medium dosage and measurement is particularly important, a temporal delay of the measurement due to an additional manual selection step is a considerable hindrance.

Moreover, the inventor has discovered that this approach anticipates that the user has the necessary knowledge to be able to assess which further effects a modification of one of the suggested parameters will then have on the measurement, in order to make an optimal selection of the parameter to be modified. Unfortunately this is not always guaranteed. Therefore the danger potentially exists that the user, possibly due to lack of knowledge, opts for a suggestion which will produce an inferior image quality than other suggestions for this measurement protocol.

At least with regard to complying with the specific absorption rate, it is known that the user when choosing a measurement protocol can also specify which measurement parameter in which form is to be adapted if the value for the specific absorption rate is exceeded by this measurement (SAR Assistant). With this solution, the user is not hindered in their workflow but must think about the parameter selection before the measurement and parameterize all measurement protocols accordingly in an additional manual work stage.

However, the inventor has discovered that the danger exists that the parameterization is forgotten, causing a contrast medium measurement to fail, for example. Furthermore, the problem with the SAR Assistant remains that the user must make the right selection of the parameter to be modified with a view to a desired examination result.

Accordingly, in at least one embodiment of the present invention, at least one alternative is provided which allows a magnetic resonance measurement to be performed or started without interruption and which does not require additional manual intervention for the monitoring of an interaction indicator, in particular STIM and/or SAR monitoring.

Embodiments of the present invention are directed to a method for adapting a parameter, corresponding computing unit and magnetic resonance installation, corresponding computer program and/or corresponding computer-readable data medium. Example and/or alternative advantageous embodiment variants are the subject matter of the claims.

Features, advantages or alternative embodiment variants mentioned in this context apply equally to the other claimed subject matter and vice versa. In other words, claims relating to certain subject matter (being directed to a method, for example) can also be developed to include features which are described or claimed in connection with one of the apparatuses. In this case, the corresponding functional features of the method are formed by modules or units which relate to corresponding subject matter.

At least one embodiment the present invention relates to a method for adapting a parameter of a parameter set for a magnetic resonance measurement of an examination object. In at least one embodiment, the method comprises:
choosing a parameter set required for the magnetic resonance measurement of the examination object;
determining at least one interaction indicator applicable to an interaction between electromagnetic radiation and a tissue of the examination object on the basis of the chosen parameter set;
comparing the interaction indicator with a previously defined upper limit for the interaction indicator and, in the event that the upper limit of the interaction indicator is exceeded;
determining a group of parameters from the parameter set, which can be adapted with a view to complying with the upper limit of the interaction indicator;
calculating a modification suggestion for a multiplicity of parameters from the group of adaptable parameters with a view to complying with the upper limit of the interaction indicator;

identifying a parameter from the group of adaptable parameters in a manner which optimizes a quality parameter of the magnetic resonance measurement; and adapting the identified parameter in accordance with its modification suggestion.

At least one embodiment of the invention further relates to a computing unit for adapting a parameter of a parameter set for a magnetic resonance measurement of an examination object, having programming for performing at least one embodiment of the method according to the invention.

At least one embodiment of the invention further relates to a computing unit for adapting a parameter of a parameter set for a magnetic resonance measurement of an examination object, comprising:

a memory storing program computer-readable instructions; and one or more processors configured to execute the instructions such that the one or more processors are configured to choose a parameter set for the magnetic resonance measurement of the examination object, determine at least one interaction indicator applicable to an interaction between electromagnetic radiation and a tissue of the examination object based upon the parameter set chosen, compare the at least one interaction indicator with a previously defined upper limit for the at least one interaction indicator, determine a group of adaptable parameters from the parameter set, upon the comparing indicating that the upper limit of the at least one interaction indicator is exceeded, adaptable with a view to complying with the upper limit of the at least one interaction indicator, calculate a modification suggestion for a multiplicity of parameters from the group of adaptable parameters with a view to complying with the upper limit of the at least one interaction indicator, identify a parameter from the group of adaptable parameters in a manner which optimizes a quality parameter of the magnetic resonance measurement, and adapt the parameter identified in accordance with the modification suggestion calculated.

An apparatus for adapting a parameter of a parameter set for a magnetic resonance measurement of an examination object, comprising:

processing circuitry configured to choose a parameter set for the magnetic resonance measurement of the examination object, determine at least one interaction indicator applicable to an interaction between electromagnetic radiation and a tissue of the examination object based upon the parameter set chosen, compare the at least one interaction indicator with a previously defined upper limit for the at least one interaction indicator, determine a group of adaptable parameters from the parameter set, upon the comparing indicating that the upper limit of the at least one interaction indicator is exceeded, adaptable with a view to complying with the upper limit of the at least one interaction indicator, calculate a modification suggestion for a multiplicity of parameters from the group of adaptable parameters with a view to complying with the upper limit of the at least one interaction indicator, identify a parameter from the group of adaptable parameters in a manner which optimizes a quality parameter of the magnetic resonance measurement, and adapt the parameter identified in accordance with the modification suggestion calculated.

At least one embodiment of the invention also relates to a magnetic resonance installation having a computing unit or apparatus according to at least one embodiment of the invention. The computing unit or apparatus is advantageously integrated in the magnetic resonance installation. Alternatively, the computing unit or apparatus can also be arranged remotely or isolated. The computing unit or apparatus can be designed in particular to perform the step of identifying a parameter to be adapted, but also an embodiment of the entire inventive method, for a magnetic resonance installation or for a multiplicity of installations, e.g. in a radiology center or hospital comprising a plurality of magnetic resonance installations.

At least one embodiment of the invention further relates to a computer program with program code, in order to perform the method according to at least one embodiment of the invention for identifying a parameter to be adapted when the computer program is executed on a computer.

At least one embodiment of the invention further relates to a non-transitory computer program product storing program code, to perform the method of an embodiment when the computer program is executed on a computer.

At least one embodiment of the invention further relates to a non-transitory computer-readable data medium with program code of a computer program, in order to perform at least one embodiment of the method according to the invention for adapting a parameter when the computer program is executed on a computer. The identification, in particular the trained identification algorithm, can advantageously be executed on a computer, e.g. in a computing unit of a magnetic resonance installation.

The aforementioned characteristics, features and advantages of this invention, and the manner in which these are achieved, become clearer and easier to understand in connection with the following description of the example embodiments, these being explained in greater detail with reference to the drawings. The description does not in any way restrict the invention to these example embodiments. Identical components are denoted by identical reference signs in different figures. The figures are not generally to scale.

BRIEF DESCRIPTION OF THE DRAWINGS

FIG. 2 shows a schematic illustration of an example embodiment of a method according to the invention.

DETAILED DESCRIPTION OF THE EXAMPLE EMBODIMENTS

Figure 1:
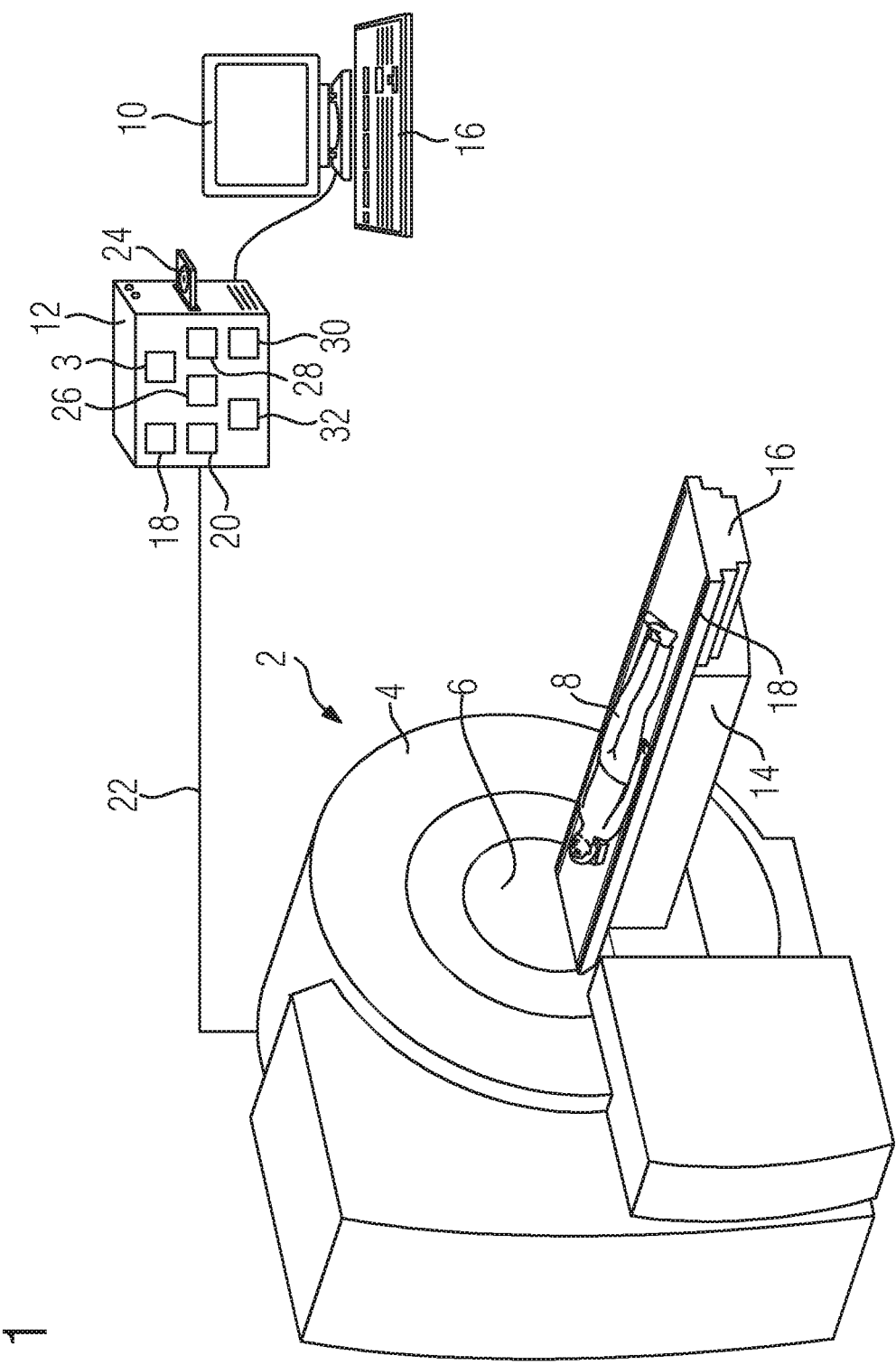
FIG. 1 shows a perspective view of a magnetic resonance installation in the form of a tomograph according to a first embodiment variant of the present invention.

The drawings are to be regarded as being schematic representations and elements illustrated in the drawings are not necessarily shown to scale. Rather, the various elements are represented such that their function and general purpose become apparent to a person skilled in the art. Any connection or coupling between functional blocks, devices, components, or other physical or functional units shown in the drawings or described herein may also be implemented by an indirect connection or coupling. A coupling between components may also be established over a wireless connection. Functional blocks may be implemented in hardware, firmware, software, or a combination thereof.

Various example embodiments will now be described more fully with reference to the accompanying drawings in which only some example embodiments are shown. Specific structural and functional details disclosed herein are merely representative for purposes of describing example embodiments. Example embodiments, however, may be embodied in various different forms, and should not be construed as being limited to only the illustrated embodiments. Rather, the illustrated embodiments are provided as examples so that this disclosure will be thorough and complete, and will fully convey the concepts of this disclosure to those skilled in the art. Accordingly, known processes, elements, and techniques, may not be described with respect to some example embodiments. Unless otherwise noted, like reference characters denote like elements throughout the attached drawings and written description, and thus descriptions will not be repeated. The present invention, however, may be embodied in many alternate forms and should not be construed as limited to only the example embodiments set forth herein.

It will be understood that, although the terms first, second, etc. may be used herein to describe various elements, components, regions, layers, and/or sections, these elements, components, regions, layers, and/or sections, should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items. The phrase "at least one of" has the same meaning as "and/or".

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below," "beneath," or "under," other elements or features would then be oriented "above" the other elements or features. Thus, the example terms "below" and "under" may encompass both an orientation of above and below. The device may be otherwise oriented (rotated 90 degrees or at other orientations) and the spatially relative descriptors used herein interpreted accordingly. In addition, when an element is referred to as being "between" two elements, the element may be the only element between the two elements, or one or more other intervening elements may be present.

Spatial and functional relationships between elements (for example, between modules) are described using various terms, including "connected," "engaged," "interfaced," and "coupled." Unless explicitly described as being "direct," when a relationship between first and second elements is described in the above disclosure, that relationship encompasses a direct relationship where no other intervening elements are present between the first and second elements, and also an indirect relationship where one or more intervening elements are present (either spatially or functionally) between the first and second elements. In contrast, when an element is referred to as being "directly" connected, engaged, interfaced, or coupled to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Also, the term "exemplary" is intended to refer to an example or illustration.

When an element is referred to as being "on," "connected to," "coupled to," or "adjacent to," another element, the element may be directly on, connected to, coupled to, or adjacent to, the other element, or one or more other intervening elements may be present. In contrast, when an element is referred to as being "directly on," "directly connected to," "directly coupled to," or "immediately adjacent to," another element there are no intervening elements present.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Before discussing example embodiments in more detail, it is noted that some example embodiments may be described with reference to acts and symbolic representations of operations (e.g., in the form of flow charts, flow diagrams, data flow diagrams, structure diagrams, block diagrams, etc.) that may be implemented in conjunction with units and/or devices discussed in more detail below. Although discussed in a particularly manner, a function or operation specified in a specific block may be performed differently from the flow specified in a flowchart, flow diagram, etc. For example, functions or operations illustrated as being performed serially in two consecutive blocks may actually be performed simultaneously, or in some cases be performed in reverse order. Although the flowcharts describe the operations as sequential processes, many of the operations may be performed in parallel, concurrently or simultaneously. In addition, the order of operations may be re-arranged. The processes may be terminated when their operations are completed, but may also have additional steps not included in the figure. The processes may correspond to methods, functions, procedures, subroutines, subprograms, etc.

Specific structural and functional details disclosed herein are merely representative for purposes of describing example embodiments of the present invention. This invention may, however, be embodied in many alternate forms and should not be construed as limited to only the embodiments set forth herein.

Units and/or devices according to one or more example embodiments may be implemented using hardware, software, and/or a combination thereof. For example, hardware devices may be implemented using processing circuitry such as, but not limited to, a processor, Central Processing Unit (CPU), a controller, an arithmetic logic unit (ALU), a digital signal processor, a microcomputer, a field programmable gate array (FPGA), a System-on-Chip (SoC), a programmable logic unit, a microprocessor, or any other device capable of responding to and executing instructions in a defined manner. Portions of the example embodiments and corresponding detailed description may be presented in terms of software, or algorithms and symbolic representations of operation on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" of "displaying" or the like, refer to the action and processes of a computer system, or similar electronic computing device/hardware, that manipulates and transforms data represented as physical, electronic quantities within the computer system's registers and memories into other data similarly represented as physical quantities within the computer system memories or registers or other such information storage, transmission or display devices.

In this application, including the definitions below, the term 'module' or the term 'controller' may be replaced with the term 'circuit.' The term 'module' may refer to, be part of, or include processor hardware (shared, dedicated, or group) that executes code and memory hardware (shared, dedicated, or group) that stores code executed by the processor hardware.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

Software may include a computer program, program code, instructions, or some combination thereof, for independently or collectively instructing or configuring a hardware device to operate as desired. The computer program and/or program code may include program or computer-readable instructions, software components, software modules, data files, data structures, and/or the like, capable of being implemented by one or more hardware devices, such as one or more of the hardware devices mentioned above. Examples of program code include both machine code produced by a compiler and higher level program code that is executed using an interpreter.

For example, when a hardware device is a computer processing device (e.g., a processor, Central Processing Unit (CPU), a controller, an arithmetic logic unit (ALU), a digital signal processor, a microcomputer, a microprocessor, etc.), the computer processing device may be configured to carry out program code by performing arithmetical, logical, and input/output operations, according to the program code. Once the program code is loaded into a computer processing device, the computer processing device may be programmed to perform the program code, thereby transforming the computer processing device into a special purpose computer processing device. In a more specific example, when the program code is loaded into a processor, the processor becomes programmed to perform the program code and operations corresponding thereto, thereby transforming the processor into a special purpose processor.

Software and/or data may be embodied permanently or temporarily in any type of machine, component, physical or virtual equipment, or computer storage medium or device, capable of providing instructions or data to, or being interpreted by, a hardware device. The software also may be distributed over network coupled computer systems so that the software is stored and executed in a distributed fashion. In particular, for example, software and data may be stored by one or more computer readable recording mediums, including the tangible or non-transitory computer-readable storage media discussed herein.

Even further, any of the disclosed methods may be embodied in the form of a program or software. The program or software may be stored on a non-transitory computer readable medium and is adapted to perform any one of the aforementioned methods when run on a computer device (a device including a processor). Thus, the non-transitory, tangible computer readable medium, is adapted to store information and is adapted to interact with a data processing facility or computer device to execute the program of any of the above mentioned embodiments and/or to perform the method of any of the above mentioned embodiments.

Example embodiments may be described with reference to acts and symbolic representations of operations (e.g., in the form of flow charts, flow diagrams, data flow diagrams, structure diagrams, block diagrams, etc.) that may be implemented in conjunction with units and/or devices discussed in more detail below. Although discussed in a particularly manner, a function or operation specified in a specific block may be performed differently from the flow specified in a flowchart, flow diagram, etc. For example, functions or operations illustrated as being performed serially in two consecutive blocks may actually be performed simultaneously, or in some cases be performed in reverse order.

According to one or more example embodiments, computer processing devices may be described as including various functional units that perform various operations and/or functions to increase the clarity of the description. However, computer processing devices are not intended to be limited to these functional units. For example, in one or more example embodiments, the various operations and/or functions of the functional units may be performed by other ones of the functional units. Further, the computer processing devices may perform the operations and/or functions of the various functional units without sub-dividing the operations and/or functions of the computer processing units into these various functional units.

Units and/or devices according to one or more example embodiments may also include one or more storage devices. The one or more storage devices may be tangible or non-transitory computer-readable storage media, such as random access memory (RAM), read only memory (ROM), a permanent mass storage device (such as a disk drive), solid state (e.g., NAND flash) device, and/or any other like data storage mechanism capable of storing and recording data. The one or more storage devices may be configured to store computer programs, program code, instructions, or some combination thereof, for one or more operating systems and/or for implementing the example embodiments described herein. The computer programs, program code, instructions, or some combination thereof, may also be loaded from a separate computer readable storage medium into the one or more storage devices and/or one or more computer processing devices using a drive mechanism. Such separate computer readable storage medium may include a Universal Serial Bus (USB) flash drive, a memory stick, a Blu-ray/DVD/CD-ROM drive, a memory card, and/or other like computer readable storage media. The computer programs, program code, instructions, or some combination thereof, may be loaded into the one or more storage devices and/or the one or more computer processing devices from a remote data storage device via a network interface, rather than via a local computer readable storage medium. Additionally, the computer programs, program code, instructions, or some combination thereof, may be loaded into the one or more storage devices and/or the one or more processors from a remote computing system that is configured to transfer and/or distribute the computer programs, program code, instructions, or some combination thereof, over a network. The remote computing system may transfer and/or distribute the computer programs, program code, instructions, or some combination thereof, via a wired interface, an air interface, and/or any other like medium.

The one or more hardware devices, the one or more storage devices, and/or the computer programs, program code, instructions, or some combination thereof, may be specially designed and constructed for the purposes of the example embodiments, or they may be known devices that are altered and/or modified for the purposes of example embodiments.

A hardware device, such as a computer processing device, may run an operating system (OS) and one or more software applications that run on the OS. The computer processing device also may access, store, manipulate, process, and create data in response to execution of the software. For simplicity, one or more example embodiments may be exemplified as a computer processing device or processor; however, one skilled in the art will appreciate that a hardware device may include multiple processing elements or processors and multiple types of processing elements or processors. For example, a hardware device may include multiple processors or a processor and a controller. In addition, other processing configurations are possible, such as parallel processors.

The computer programs include processor-executable instructions that are stored on at least one non-transitory computer-readable medium (memory). The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc. As such, the one or more processors may be configured to execute the processor executable instructions.

The computer programs may include: (i) descriptive text to be parsed, such as HTML (hypertext markup language) or XML (extensible markup language), (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C #, Objective-C, Haskell, Go, SQL, R, Lisp, Java®, Fortran, Perl, Pascal, Curl, OCaml, Javascript®, HTML5, Ada, ASP (active server pages), PHP, Scala, Eiffel, Smalltalk, Erlang, Ruby, Flash®, Visual Basic®, Lua, and Python®.

Further, at least one embodiment of the invention relates to the non-transitory computer-readable storage medium including electronically readable control information (processor executable instructions) stored thereon, configured in such that when the storage medium is used in a controller of a device, at least one embodiment of the method may be carried out.

The computer readable medium or storage medium may be a built-in medium installed inside a computer device main body or a removable medium arranged so that it can be separated from the computer device main body. The term computer-readable medium, as used herein, does not encompass transitory electrical or electromagnetic signals propagating through a medium (such as on a carrier wave); the term computer-readable medium is therefore considered tangible and non-transitory. Non-limiting examples of the non-transitory computer-readable medium include, but are not limited to, rewriteable non-volatile memory devices (including, for example flash memory devices, erasable programmable read-only memory devices, or a mask read-only memory devices); volatile memory devices (including, for example static random access memory devices or a dynamic random access memory devices); magnetic storage media (including, for example an analog or digital magnetic tape or a hard disk drive); and optical storage media (including, for example a CD, a DVD, or a Blu-ray Disc). Examples of the media with a built-in rewriteable non-volatile memory, include but are not limited to memory cards; and media with a built-in ROM, including but not limited to ROM cassettes; etc. Furthermore, various information regarding stored images, for example, property information, may be stored in any other form, or it may be provided in other ways.

The term code, as used above, may include software, firmware, and/or microcode, and may refer to programs, routines, functions, classes, data structures, and/or objects. Shared processor hardware encompasses a single microprocessor that executes some or all code from multiple modules. Group processor hardware encompasses a microprocessor that, in combination with additional microprocessors, executes some or all code from one or more modules. References to multiple microprocessors encompass multiple microprocessors on discrete dies, multiple microprocessors on a single die, multiple cores of a single microprocessor, multiple threads of a single microprocessor, or a combination of the above.

Shared memory hardware encompasses a single memory device that stores some or all code from multiple modules. Group memory hardware encompasses a memory device that, in combination with other memory devices, stores some or all code from one or more modules.

The term memory hardware is a subset of the term computer-readable medium. The term computer-readable medium, as used herein, does not encompass transitory electrical or electromagnetic signals propagating through a medium (such as on a carrier wave); the term computer-readable medium is therefore considered tangible and non-transitory. Non-limiting examples of the non-transitory computer-readable medium include, but are not limited to, rewriteable non-volatile memory devices (including, for example flash memory devices, erasable programmable read-only memory devices, or a mask read-only memory devices); volatile memory devices (including, for example static random access memory devices or a dynamic random access memory devices); magnetic storage media (including, for example an analog or digital magnetic tape or a hard disk drive); and optical storage media (including, for example a CD, a DVD, or a Blu-ray Disc). Examples of the media with a built-in rewriteable non-volatile memory, include but are not limited to memory cards; and media with a built-in ROM, including but not limited to ROM cassettes; etc. Furthermore, various information regarding stored images, for example, property information, may be stored in any other form, or it may be provided in other ways.

The apparatuses and methods described in this application may be partially or fully implemented by a special purpose computer created by configuring a general purpose computer to execute one or more particular functions embodied in computer programs. The functional blocks and flowchart elements described above serve as software specifications, which can be translated into the computer programs by the routine work of a skilled technician or programmer.

Although described with reference to specific examples and drawings, modifications, additions and substitutions of example embodiments may be variously made according to the description by those of ordinary skill in the art. For example, the described techniques may be performed in an order different with that of the methods described, and/or components such as the described system, architecture, devices, circuit, and the like, may be connected or combined to be different from the above-described methods, or results may be appropriately achieved by other components or equivalents.

At least one embodiment the present invention relates to a method for adapting a parameter of a parameter set for a magnetic resonance measurement of an examination object. In at least one embodiment, the method comprises:
choosing a parameter set required for the magnetic resonance measurement of the examination object;
determining at least one interaction indicator applicable to an interaction between electromagnetic radiation and a tissue of the examination object on the basis of the chosen parameter set;
comparing the interaction indicator with a previously defined upper limit for the interaction indicator and, in the event that the upper limit of the interaction indicator is exceeded;
determining a group of parameters from the parameter set, which can be adapted with a view to complying with the upper limit of the interaction indicator;
calculating a modification suggestion for a multiplicity of parameters from the group of adaptable parameters with a view to complying with the upper limit of the interaction indicator;
identifying a parameter from the group of adaptable parameters in a manner which optimizes a quality parameter of the magnetic resonance measurement; and
adapting the identified parameter in accordance with its modification suggestion.

At least one embodiment the inventive method is intended to automatically monitor an interaction indicator for a magnetic resonance measurement and set it to a permissible value in a manner which optimizes a quality measure of the magnetic resonance measurement.

Within the meaning of at least one embodiment of the present invention, an interaction indicator characterizes a measure for an interaction of the electromagnetic field or electromagnetic radiation caused by the magnetic resonance measurement with tissue of an examination object. The interaction indicator can be a measure for an energy deposition in the tissue. The interaction indicator can alternatively be a measure for an excitation of tissue, e.g. nerve tissue or muscle tissue, by the electromagnetic radiation and characterize e.g. a measure for tissue activity which is induced or amplified by the magnetic field. In particular, the interaction indicator can be the specific absorption rate (SAR) of electromagnetic radiation in tissue of the examination object or the stimulation or stimulation rate (STIM) of tissue of the examination object. Other forms of the interaction indicator are likewise conceivable.

Without thereby restricting its general applicability, the following description assumes that an examination object is a patient, usually a human. However, the patient can also be an animal in principle. The two terms "examination object" and "patient" are therefore also used synonymously in the following. However, the examination object can also be a plant or a non-living object, e.g. a historical artifact or similar.

The choice of a parameter set that is required for the magnetic resonance measurement of the examination object corresponds to a first step of the inventive method. The parameter set can be a measurement protocol. A parameter set or a measurement protocol comprises a plurality of (but at least two) measurement parameters or parameters which define the magnetic resonance measurement. The parameter sets and values of the parameters differ according to the body region that is to be examined during the magnetic resonance measurement, whether specific organs are to be depicted, e.g. blood vessels or the brain, or whether a functional examination is to be performed for the purpose of testing a physiological function, e.g. flow of blood through specific areas or the heart activity, etc. The parameter values can also differ according to which medical question led to the magnetic resonance examination and what image quality is required in order to answer the question.

A parameter can be e.g. the number of layers to be measured, the layer thickness, the repetition time, the flip angle, the gradient rise time, the field of view and many more.

In at least one embodiment, the choice comprises a transfer of the desired parameter set to a magnetic resonance installation. In other words, this step involves the configuration of the magnetic resonance installation in accordance with the desired measurement. The choice of the parameter set therefore represents an essential aspect of the preparation for a magnetic resonance measurement.

The determination of at least one interaction indicator applicable to an interaction between magnetic radiation and a tissue of the examination object on the basis of the chosen parameter set may, in at least one embodiment, represent a second step of the present method. Provision is preferably made for determining at least two or more interaction indicators in parallel. The chosen parameters are used in this step as an input for the purpose of calculating or determining an interaction indicator by way of a stored rule. The rule comprises computing steps which convert the specific parameter combination for the chosen measurement protocol into an interaction indicator. The rule may be manufacturer-dependent and/or installation-dependent.

In at least one embodiment of the inventive method, a comparison is made between the calculated interaction indicator and a previously defined upper limit for the interaction indicator. The upper limit corresponds to a maximum value for the interaction indicator, which value is still permissible from the perspective of patient safety. The upper limit can be derived e.g. from IEC 60601-2-33, "Medical electrical equipment—2-33: Particular requirements for the safety of magnetic resonance equipment for medical diagnosis" or specified by the manufacturer in compliance with IEC 60601-2-33, the entire contents of each of which is hereby incorporated herein by reference. The value for the upper limit can be retrievably stored in a memory. If the calculated value of the interaction indicator is below the upper limit, the magnetic resonance measurement is started.

If the comparison shows that the upper limit for at least one of the interaction indicators is exceeded, provision may be made in at least one embodiment, in a fourth step of the inventive method for determining a group of parameters from the parameter set, which group of parameters can be adapted with a view to complying with the upper limit of the interaction indicator. In other words, provision may be made here for determining those parameters comprised in the measurement protocol whose value adaptation could result in a reduction of the interaction indicator with a view to reaching the maximum value or falling below the maximum value. The group may comprise a multiplicity of parameters or only one or two parameters.

This step can determine all parameters whose modification could result in reaching or falling below the upper limit for the interaction indicator. However, provision can alternatively be made in this step, in at least one embodiment, for taking into account certain settings or specifications of the measurement protocol which exclude specific parameters from any adaptation. For example, if the protocol comprises special adjustments, e.g. a B1 shim or an RF shim, provision can be made for all parameters which have an influence on the geometry of the measurement, e.g. number of layers, field of view or layer thickness, etc. to be excluded in advance from any modification or adaptation, in order to avoid an essentially complete reconfiguration of the magnetic resonance installation. In particular, this advantageously makes allowance for a smooth and rapid workflow.

In a fifth step in at least one embodiment, provision is made for calculating a modification suggestion for a multiplicity of parameters from the group of adaptable parameters with a view to complying with the upper limit of the interaction indicator. In other words, values are quantified here for the adaptation of the parameters in the group of adaptable parameters, by which values it is possible to comply with the upper limit of the interaction indicator. Provision can be made for determining a modification suggestion for all, only a few, or just one of the parameters in the group of adaptable parameters. Provision can also be made in this step, taking specifications of the measurement protocol into account (e.g. a fixed measurement time), for excluding specific parameters from a suggestion calculation.

In a sixth step of at least one embodiment of the inventive method, provision is made for identifying a parameter from the group of adaptable parameters in a manner which optimizes a quality measure of the magnetic resonance measurement. In this step, a selection is therefore made of that parameter which is actually modified in accordance with the calculated modification suggestion. This selection or identification is based on selection heuristics which are aimed at optimizing a quality measure. In other words, a parameter is selected for the adaptation, whose modification least influences, impairs or generally reduces a quality measure of the measurement.

The quality measure concerned may be the image quality achieved by the measurement, in particular the spatial resolution in at least one dimension, or the resulting image contrast of the generated image recordings. The quality measure may also be the duration of the measurement or the measurement time. The quality measure may also be the extent of the additional adaptations/modifications, caused by the adaptation of the parameter, in view of the choice of the measurement protocol at the installation. Other embodiments of the quality measure are also possible. The quality measure concerned may take the form of a combination of at least two of the individual variables cited above, or further individual variables which are used as a quality measure.

A combination may be realized e.g. by weighing up the negative effects of different variables as a result of selecting a specified parameter, e.g. in the form of a compromise between spatial resolution and measurement time. In the method according to at least one embodiment of the invention, the quality measure is determined automatically and as a function of the chosen measurement protocol. In order to achieve this, the method can automatically take into account and/or evaluate various information relating to the chosen measurement protocol, the magnetic resonance installation used, the body region to be examined, etc.

In a final step of t least one embodiment of the inventive method, provision is made for adapting the identified parameter in accordance with its modification suggestion. This adaptation advantageously takes place automatically and without user input. In other words, the choice of the measurement protocol is adapted to the new value of the identified parameter, i.e. this parameter is assigned the value corresponding to the modification suggestion during the configuration of the magnetic resonance installation for the magnetic resonance measurement. This step can also include the adaptation of further parameters or adjustment of the measurement protocol if this is required as a result of adapting the identified parameter.

In summary, the inventor has found that, in a manner which takes a quality measure into account, automatic selection of a parameter to be adapted in order to comply with an upper limit of an interaction indicator can be achieved without user input and excluding the danger of an incorrect decision. The workflow of a magnetic resonance measurement is thereby shortened and erroneous user input is avoided, irrespective of the interaction indicator concerned.

According to one embodiment of the invention, in the event that the specific absorption rate (SAR) is the interaction indicator, the group of adaptable parameters comprises at least the following parameters: number of layers, TR repetition time and flip angle, and in the event that the stimulation rate (STIM) is the interaction indicator, at least the following parameters: layer thickness, gradient rise time and field of view. In other words, when monitoring the specific absorption rate, at least the number of layers, the TR repetition time and the flip angle are considered within the sense of the inventive selection heuristics with a view to an adaptation, and when monitoring the stimulation rate, at least the layer thickness, the gradient rise time and the field of view are considered. As a result of the adaptation of one of the respectively assigned parameters, it is advantageously possible to comply with the upper limit of the interaction indicator in a simple manner. As explained above, when monitoring a plurality of interaction indicators, it is also possible to consider the totality of all parameters assigned to individual interaction indicators.

According to another embodiment of the invention, the identification of the parameter takes place in a manner which takes further parameters of the chosen parameter set into account. In this context, the selection heuristics can take into account the presence of at least one other parameter and/or the chosen value of the at least one parameter. In particular, the heuristics can include all other parameters in the selection. It is particularly advantageous if the method takes particular specifications of the protocol into account, since it is thereby possible to limit the effort involved in updating the choice of the measurement protocol at the installation. As mentioned in the introduction, it is thereby possible e.g. to avoid a complete readjustment in the event that the measurement protocol comprises a B1 shim. A further example is the restriction of a measurement duration. If this is fixed in the measurement protocol, parameters whose modification would affect the measurement duration are ignored by the selection heuristics.

According to a further embodiment of the present invention, the identification of the parameter takes place as a selection of that parameter whose suggested modification corresponds to the smallest parameter modification. In this context, the selection heuristics are based on a comparison of all modification suggestions determined for the parameters in the group of adaptable parameters. This approach is based on the idea that the smallest of all possible parameter modifications also has the least influence on the quality measure concerned, e.g. the image quality and/or the need for further adaptations when choosing the measurement protocol.

A further embodiment of the present invention provides for the identification of the parameter to be done in a manner which takes into account that body region of the examination object which is to be depicted by the magnetic resonance measurement. Here, as mentioned in the introduction, the fact is taken into account that for many measurements, the examined body region alone can already specify information about a relevant quality measure and/or the value to be achieved for the quality measure. In this case, the selection heuristics exclude the modification of specified parameters in advance. For example, in the case of head or brain measurements, the image quality in terms of a high spatial resolution is generally important, in contrast with e.g. the required measurement time. In this respect, provided this is not at variance with any other specifications of the protocol, provision is preferably made for e.g. extending the repetition time, which would not have any influence on the image quality.

In another embodiment of the present invention, the identification of the parameter is done in a manner which takes into account system components of the magnetic resonance installation used for the magnetic resonance measurement. In other words, the selection or identification of the parameters to be adapted can be determined by the presence of specified hardware of the magnetic resonance installation. For example, high-end installations by virtue of their comparatively superior equipment are generally used for special examinations in which the image quality of the generated images is particularly important in contrast with the measurement time. In the absence of instructions to the contrary, the selection heuristics here will preferably select for adaptation a parameter whose modification has no negative influence on the image quality. For example, the heuristics could adapt the repetition time in this case, but not the flip angle. In the case of low-end devices which are regularly used for standard examinations performed on a routine basis, the measurement time (i.e. the occupancy duration of the installation for a measurement) is critical. Therefore the selection heuristics here could preferably provide for adapting the flip angle instead of the repetition time.

According to a preferred embodiment of the present invention, the identification of the parameter is done via a trained identification algorithm. In other words, the identification algorithm is designed to select a quality parameter which is suitable for the chosen measurement protocol and, in a manner which complies with the quality parameter, to select a parameter to be adapted. In particular, the identification algorithm is designed in this case to analyze the instructions described above, the instructions coming from or relating to the chosen measurement protocol. Therefore the identification algorithm is designed in particular to perform a modification suggestion comparison, and automatically take into account further specifications of the measurement protocol, e.g. specified adjustments or specifications relating to the measurement duration, instructions about the body region, etc.

According to a further embodiment of the present invention, the identification algorithm is based on a machine learning process, a statistical method, a mapping rule, mathematical functions or an artificial neural network.

A machine learning process can refer to the artificial generation of knowledge from experience. An artificial system learns from examples in a training phase and is able to generalize after completion of the training phase. The identification algorithm and/or the underlying selection heuristics can therefore be continuously adapted. The use of machine learning processes may include the recognition of patterns and regularities in the training data. After the training phase, the identification algorithm can be applied to e.g. previously unknown parameter sets and identify a corresponding parameter to be adapted with a view to complying with a quality measure associated with a parameter set.

The statistical method, in at least one embodiment, can include e.g. fuzzy logic, a self-organizing map, resampling, pattern recognition or support vector machine. On the basis of the experience of the identification algorithm with regard to patterns or regularities, it is advantageously possible to effect an identification of a parameter to be adapted.

The trained identification algorithm may include, in at least one embodiment, an assignment rule, a neural network, a system, a learning transfer method or an algorithm which is based on a database or on mathematical functions or equations. The trained identification algorithm can be created or improved or adapted on the basis of known data from historical magnetic resonance measurements. For example, combinations of the following information can be used as input data for the training of the identification algorithm:

measurement protocols of old measurements, information about the magnetic resonance installation used, calculated modification suggestions for parameters of the group of parameters to be adapted and/or body region to be examined, and the respectively identified parameters to be adapted. This data can be obtained e.g. from log files of all the magnetic resonance installations in the field.

If the identification algorithm is a neural network, supervised learning can be used as a training method, since in addition to the old magnetic resonance measurements the identified parameters to be adapted can also be supplied as input data in each case. An identified parameter to be adapted can correspond to an unequivocal relationship or a relationship with qualified probability. Patterns or regularities from the historical training data can advantageously be applied to a current measurement protocol of the magnetic resonance measurement.

At least one embodiment of the invention further relates to a computing unit for adapting a parameter of a parameter set for a magnetic resonance measurement of an examination object, having programming for performing at least one embodiment of the method according to the invention.

At least one embodiment of the invention also relates to a magnetic resonance installation having a computing unit according to at least one embodiment of the invention. The computing unit is advantageously integrated in the magnetic resonance installation. Alternatively, the computing unit can also be arranged remotely or isolated. The computing unit can be designed in particular to perform the step of identifying a parameter to be adapted, but also an embodiment of the entire inventive method, for a magnetic resonance installation or for a multiplicity of installations, e.g. in a radiology center or hospital comprising a plurality of magnetic resonance installations.

At least one embodiment of the invention further relates to a computer program with program code, in order to perform the method according to at least one embodiment of the invention for identifying a parameter to be adapted when the computer program is executed on a computer.

At least one embodiment of the invention further relates to a computer-readable data medium with program code of a computer program, in order to perform at least one embodiment of the method according to the invention for adapting a parameter when the computer program is executed on a computer. The identification, in particular the trained identification algorithm, can advantageously be executed on a computer, e.g. in a computing unit of a magnetic resonance installation.

The magnetic resonance installation shown in FIG. 1 in the form of a magnetic resonance tomograph 2 comprises a hollow cylindrical base unit 4 in whose interior, the so-called tunnel 6, an electromagnetic field is generated during operation for the purpose of a magnetic resonance measurement or examination of an examination object in the form of a patient 8. Provision is further made for a patient table 14 with a mobile couch support 16. The patient 8 can be positioned on the couch support 16, e.g. as illustrated. The patient table 14 positioned at the edge of the base unit 4 in such a way that the couch support 16 with patient 8 can be introduced at least partially into the tunnel 6 for the examination.

The tomograph 2 has a computing unit in the form of a computer system 12, which is embodied as a computer and connected to a display unit 10, e.g. for the graphical display of reconstructed magnetic resonance tomography recordings, and to an input unit 16. The display unit 10 can be e.g. an LCD, plasma or OLED display screen. It can also be a touch-sensitive display screen which is also designed as an input unit 16. Such a touch-sensitive display screen can be integrated into the imaging device or embodied as part of a mobile device. The input unit 10 is e.g. a keyboard, a mouse, a so-called "touch screen" or even a microphone for voice input. The input unit 16 can also be configured to detect movements of a user and translate these into corresponding commands.

The computer system 12 is designed to execute an embodiment of an inventive method as described in greater detail with reference to FIG. 2, for example. To this end, the computer system has a connection to the base unit 4 of the tomograph 2 for the purpose of exchanging data. For example, control signals for the tomograph 2 can be transferred from the computer system 12 to the base unit 4 for the purpose of the magnetic resonance examination. In order to achieve this, e.g. various measurement protocols compatible in each case with an examination type can be stored in a memory 18 and selected by a user, e.g. a doctor or medically trained member of staff, before the measurement according to the nature of a medical problem. For this purpose, various measurement protocols can be output to the user via the display unit 10 for selection, and the user can select one of the measurement protocols via the input unit 16, e.g. by mouse click.

Alternatively, the user can also input a measurement protocol $\{P1, P2, \ldots, Pn\}$ in the form of a totality of individual measurement parameters $P1, P2, \ldots, Pn$ such as number of layers, layer thickness, field of view, repetition time, etc. via the input unit 16. Alternatively, the measurement protocol $\{P1, P2, \ldots, Pn\}$ can also be provided to the tomograph 2 automatically or remotely by a remote user via an intranet or internet from a central specification unit (not illustrated) via corresponding data connections. This specified measurement protocol $\{P1, P2, \ldots, Pn\}$ is used as a basis for setting up the tomograph 2 for the examination. The activation of the base unit 4 is effected in accordance with the selected measurement protocol $\{P1, P2, \ldots, Pn\}$. At the same time, recorded measurement data is captured for further processing in a reconstruction unit 20, which is not described in detail. The connection 22 is realized in a conventional manner, wired or wireless, via corresponding interfaces.

The computer system 12 comprises a determination unit 26. This is configured to determine, on the basis of the selected measurement protocol $\{P1, P2, \ldots, Pn\}$ or the chosen parameter set $\{P1, P2, \ldots, Pn\}$, at least one interaction indicator I applicable to an interaction between electromagnetic radiation and a tissue of the patient 8. For this purpose, the determination unit 26 can use a computing rule which converts the parameters $P1, P2, \ldots, Pn$ comprised in the parameter set $\{P1, P2, \ldots, Pn\}$ into an interaction indicator I. The interaction indicator I can preferably be the specific absorption rate (SAR) or the stimulation (STIM), for example. In particular, stored calculation rules may be manufacturer-dependent.

The computer system 12 further comprises a comparison unit 28, which is used to compare the interaction indicator I with a previously defined upper limit MAX(I) for the interaction indicator. The value for the upper limit MAX(I) can be stored in the memory 18 of the computer system 12, for example, such that it can be retrieved by the comparison unit 28. The upper limit MAX(I) in this case corresponds to a value for an interaction associated with the magnetic resonance measurement between electromagnetic radiation and patient tissue, which is not expected to result in any damage to the health of the patient. As an output, the comparison unit 28 specifies whether or not the upper limit MAX(I) is complied with and if applicable how great the difference is between calculated interaction indicator I and upper limit MAX(I). The output takes place at the determination unit 26.

The latter is also configured to determine, if the upper limit MAX(I) is exceeded, a group G(P1, P2, ..., Pn) of parameters from the parameter set {P1, P2, ..., Pn}, which can be adapted with a view to complying with the upper limit MAX(I) of the interaction indicator I.

The computer system 12 also comprises a calculation unit 30, which is designed to calculate a modification suggestion M(PG1), M(PG2), ..., M(PGn) for a multiplicity of parameters P1, P2, ..., Pn from the group G(P1, P2, ..., Pn) of adaptable parameters with a view to complying with the upper limit MAX(I) of the interaction indicator (I). The calculation unit 30 is therefore configured, for adaptable parameters from the group G(P1, P2, ..., Pn) of adaptable parameters, to determine and/or quantify possible modifications which would result in compliance with the interaction indicator I.

The computer system 12 also comprises an identification unit 32, which is configured to identify a parameter P1, P2, ..., Pn from the group G(P1, P2, ..., Pn) of adaptable parameters as the parameter Pa to be adapted, in a manner which optimizes a quality parameter Q of the magnetic resonance measurement. For this purpose, the identification unit 32 preferably refers to a trained identification algorithm which makes the selection of the parameter Pa to be adapted in such a way that a quality parameter Q of the magnetic resonance measurement is optimized. For example, a quality parameter Q can be a measure for the image quality or the measurement time.

The cited units 26, 28, 30 and 32 in particular are embodied here as separate modules within the computer system 12, the modules exchanging data with each other as necessary. Alternatively, all of the cited units can be integrated as a computing unit or processor, the integrality being physical or functional.

The computer system 12 can interact with a computer-readable data medium 24, in particular in order to perform a method according to an embodiment of the invention via a computer program with program code. Furthermore, the computer program can be stored in a retrievable manner on the machine-readable medium 24. In particular, the machine-readable medium 24 can be a CD, DVD, Blu-Ray disk, memory stick or hard disk.

The units 26, 28, 30 and 32 in particular can be designed in the form of hardware or in the form of software. For example, the units are designed as so-called FPGAs (field programmable gate arrays) or comprise an arithmetic-logic unit.

At least one computer program can be stored in the memory 18 of the computer system 12, the computer program performing all method steps of embodiments of the inventive method when it is executed on the computer. The computer program for executing the method steps of embodiments of the inventive method comprises program code. Furthermore, the computer program can be designed as an executable file and/or stored on a different computing system than the computer system 12. For example, the magnetic resonance tomograph 2 can be configured in such a way that the computer system 12 loads the computer program for executing embodiments of the inventive method into its internal working memory via an intranet or via the internet. Alternatively, it may be envisaged that the computer system 12 itself is part of an internet or intranet, e.g. an HIS (Hospital Information system) or an RIS (Radiology Information system), and has access to measurement protocols that have been input, selected or centrally stored for various magnetic resonance tomographs of the facility, in order for embodiments of the inventive method to be able to be executed centrally for various tomographs.

FIG. 2 shows a schematic diagram of an example embodiment of an inventive method for adapting a parameter of a parameter set for a magnetic resonance measurement of a patient 8. This method serves to adapt a parameter set for a magnetic resonance measurement automatically, i.e. without the need for user input, in such a way that the measurement does not cause any health risk to the patient 8. Accordingly, a measurement parameter Pa is determined whose modification results in the compliance of at least one interaction indicator I, e.g. the SAR and/or the STIM. When selecting the measurement parameter Pa to be adapted, embodiments of the inventive method also takes into account further effects on the measurement, which may be caused by the adaptation of the parameter Pa. Therefore the selection of the parameter Pa to be adapted depends on the influence on a quality parameter Q of the magnetic resonance measurement. A quality parameter Q can be e.g. a desired contrast or a spatial resolution in the image data generated by the measurement. An incorrect manual selection of a measurement parameter, which would be disadvantageous for the measurement result, is avoided in this way.

In step S1 of an embodiment of the inventive method, provision is made for choosing a parameter set {P1, P2, ..., Pn} that is required for the magnetic resonance measurement of an examination object 8. In other words, the tomograph 2 in this step is preconfigured or preset for the measurement. This step may also comprise the reception, transmission, transfer, and perhaps manual input or selection of a measurement protocol or a parameter set {P1, P2, ..., Pn} at the tomograph or tomographs 2. For example, the parameters P1, P2, ..., Pn and possibly the parameter values differ considerably according to the body region that is to be depicted (e.g. brain vs. abdomen).

In step S2, provision is made for determining at least one interaction indicator I applicable to an interaction between electromagnetic radiation and a tissue of the examination object 8 on the basis of the chosen parameter set {P1, P2, ..., Pn}. The chosen parameter set {P1, P2, ..., Pn} defines how long a patient 8 is exposed to a magnetic field of specified strength and at the same time determines the extent of interaction between tissue and magnetic field. A range of critical limit values are provided for this purpose, i.e. at least an upper limit MAX(I) for an interaction indicator, and must not be exceeded during a measurement. Step S2 ascertains the extent of the interaction I that is caused by the planned measurement, by calculating e.g. the specific absorption (SAR) and/or stimulation (STIM) on the basis of the chosen parameters P1, P2, ..., Pn.

In step S3, provision is made for comparing the interaction indicator I with the upper limit MAX(I) for the interaction indicator I. The upper limit MAX(I) is defined and stored in advance. It can be device-specific or manufacturer-specific, for example. If a comparison shows that the planned measurement complies with the limit (+), the magnetic resonance measurement can be started immediately in a step S8 without further interruptions.

If the upper limit of the interaction indicator is exceeded (−), step S4 provides for determining a group G(P1, P2, ..., Pn)={PG1, PG2, ..., PGn} of parameters from the parameter set {P1, P2, ..., Pn}, which can be adapted with a view to complying with the upper limit MAX(I) of the interaction indicator I. In other words, all parameters PG1, PG2, . . . , PGn which could be so modified as to allow compliance with the upper limit MAX(I) are identified in step S4.

In step S5, provision is made for calculating a modification suggestion M(PG1), M(PG2), . . . , M(PGn) for a multiplicity of parameters PG1, PG2, . . . , PGn from the group G(P1, P2, . . . , Pn) of adaptable parameters with a view to complying with the upper limit MAX(I) of the interaction indicator I. In other words, step S5 quantifies how great a modification of a specified parameter must be in order to comply with the upper limit MAX(I). As a result of adapting a parameter from the group G(P1, P2, . . . , Pn), in addition to the compliance of the interaction indicator I, a quality parameter Q for the measurement may also be changed and in particular reduced, e.g. the image quality that is achieved may be reduced as a result of the reconfiguration of a parameter.

In order to guard against this, and prevent or minimize any impairment or degradation of a quality parameter, provision is made in step S6 for identifying a parameter Pa from the group G(P1, P2, . . . , Pn) of adaptable parameters in a manner which optimizes a quality parameter Q of the magnetic resonance measurement. This step therefore takes into account that a modification of the parameter Pa as per the relevant modification suggestion M(PGa) could also change or impair a quality parameter Q of the magnetic resonance measurement. A quality parameter Q may be e.g. the image quality or the duration of the measurement, but may also be the extent of adaptations of the choice of measurement protocol {P1, P2, . . . , Pn} caused by the modifications.

In the context of the identification, an embodiment of the inventive method therefore takes into account what effect a possible modification of one of the parameters PG1, PG2, . . . , PGn will have on a quality parameter Q. In this case, when determining the quality parameter Q concerned, an embodiment of the inventive identification can first take additional information about the chosen measurement protocol {P1, P2, . . . , Pn} into account, e.g. information about hardware of the magnetic resonance installation used for the measurement, the presence or absence of and/or the values of specified measurement parameters P1, P2, . . . , Pn in the chosen measurement protocol {P1, P2, . . . , Pn}, the body region to be examined, modification suggestions M(PG1), M(PG2), . . . , M(PGn) for other adaptable parameters PG1, PG2, . . . , PGn, etc., in order thus to identify a parameter Pa for adaptation which is best suited to adaptation for the planned measurement.

The identification of the parameter Pa is inventively effected via an identification algorithm. This is most preferably an algorithm which can be trained. This algorithm, e.g. in the form of a neuronal network, is designed on the basis of historical data to derive and adapt rules for the selection of a parameter Pa that is to be adapted. This approach corresponds mathematically to an optimization problem. The identification algorithm in this way also identifies those parameters as parameters to be adapted, whose modification as per a modification suggestion M(Pa) least negatively influences a previously determined quality parameter Q.

In step S7, provision is made for adapting the identified parameter Pa to be adapted, in accordance with its modification suggestion M(Pa). This step can also comprise reconfigurations of other measurement parameters that may become necessary as a result of the adaptation.

In step S8, provided there is now compliance with the interaction indicator I, the measurement is started without interruption. Alternatively, a check loop can be provided by step S3 for safety purposes before the measurement is started in step S8.

Where not explicitly stated but applicable and within the sense of the invention, individual example embodiments and individual part aspects or features thereof can be combined with each other or interchanged without thereby departing from the scope of the present invention. Advantages of the invention which are described with reference to an example embodiment also relate where transferable to other example embodiments without these being cited explicitly.

The patent claims of the application are formulation proposals without prejudice for obtaining more extensive patent protection. The applicant reserves the right to claim even further combinations of features previously disclosed only in the description and/or drawings.

References back that are used in dependent claims indicate the further embodiment of the subject matter of the main claim by way of the features of the respective dependent claim; they should not be understood as dispensing with obtaining independent protection of the subject matter for the combinations of features in the referred-back dependent claims. Furthermore, with regard to interpreting the claims, where a feature is concretized in more specific detail in a subordinate claim, it should be assumed that such a restriction is not present in the respective preceding claims.

Since the subject matter of the dependent claims in relation to the prior art on the priority date may form separate and independent inventions, the applicant reserves the right to make them the subject matter of independent claims or divisional declarations. They may furthermore also contain independent inventions which have a configuration that is independent of the subject matters of the preceding dependent claims.

None of the elements recited in the claims are intended to be a means-plus-function element within the meaning of 35 U.S.C. § 112(f) unless an element is expressly recited using the phrase "means for" or, in the case of a method claim, using the phrases "operation for" or "step for."

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A method for adapting a parameter of a parameter set for a magnetic resonance measurement of an examination object, the method comprising:
   choosing a parameter set for the magnetic resonance measurement of the examination object;
   determining at least one interaction indicator applicable to an interaction between electromagnetic radiation and a tissue of the examination object based upon the parameter set chosen;
   comparing an interaction indicator value with an upper limit for the at least one interaction indicator;
   determining a group of adaptable parameters from the parameter set, the group of adaptable parameters being adaptable in accordance with the upper limit of the at least one interaction indicator;
   calculating a modification suggestion for a multiplicity of parameters from the group of adaptable parameters;

identifying at least one parameter from the group of adaptable parameters based on a projected effect of the modification on a quality parameter of the magnetic resonance measurement; and adapting the identified at least one parameter in accordance with the calculated modification suggestion.

2. The method of claim 1, wherein the at least one interaction indicator is a specific absorption rate, and the group of adaptable parameters includes at least a number of layers, a TR repetition time, and a flip angle.

3. The method of claim 1, wherein the identifying the at least one parameter is further based on further parameters of the parameter set.

4. The method of claim 3, wherein the identifying the at least one parameter includes identifying the at least one parameter based on a smallest parameter modification of the calculated modification suggestions.

5. The method of claim 1, wherein the identifying the at least one parameter is further based on a body region of the examination object.

6. The method of claim 1, wherein the identifying the at least one parameter is further based on system components of a magnetic resonance installation used for the magnetic resonance measurement.

7. The method of claim 1, wherein the identifying identifies the at least one parameter using a trained identification algorithm.

8. The method of claim 7, wherein the identification algorithm is based on a machine learning process, a statistical method, a mapping rule, mathematical functions or an artificial neural network.

9. A computing unit for adapting a parameter of a parameter set for a magnetic resonance measurement of an examination object, comprising:

a memory storing program computer-readable instructions; and one or more processors configured to execute the instructions such that the one or more processors are configured to cause the computing unit to, choose a parameter set for the magnetic resonance measurement of the examination object, determine at least one interaction indicator applicable to an interaction between electromagnetic radiation and a tissue of the examination object based upon the parameter set chosen, compare an interaction indicator value with an upper limit for the at least one interaction indicator, determine a group of adaptable parameters from the parameter set, the group of adaptable parameters being adaptable in accordance with the upper limit of the at least one interaction indicator, calculate a modification suggestion for a multiplicity of parameters from the group of adaptable parameters, identify at least one parameter from the group of adaptable parameters based on a projected effect of the modification on a quality parameter of the magnetic resonance measurement, and adapt the identified at least one parameter in accordance with the calculated modification suggestion.

10. A magnetic resonance installation comprising the computing unit of claim 9.

11. A non-transitory computer program product storing program code, to perform the method of claim 1 when the computer program is executed on a computer.

12. A non-transitory computer-readable data medium storing program code of a computer program, to perform the method of claim 1 when the computer program is executed on a computer.

13. The method of claim 1, wherein the at least one interaction indicator is a stimulation rate and the group of adaptable parameters includes at least a layer thickness, a gradient rise time, and a field of view.

14. The magnetic resonance installation of claim 10, wherein the computing unit is integrated in the magnetic resonance installation.

15. The magnetic resonance installation of claim 10, wherein the computing unit is arranged remotely or isolated from the magnetic resonance installation.

16. An apparatus for adapting a parameter of a parameter set for a magnetic resonance measurement of an examination object, comprising:

processing circuitry configured to cause the apparatus to, choose a parameter set for the magnetic resonance measurement of the examination object, determine at least one interaction indicator applicable to an interaction between electromagnetic radiation and a tissue of the examination object based upon the parameter set chosen, compare an interaction indicator value with an upper limit for the at least one interaction indicator, determine a group of adaptable parameters from the parameter set, the group of adaptable parameters being adaptable in accordance with the upper limit of the at least one interaction indicator, calculate a modification suggestion for a multiplicity of parameters from the group of adaptable parameters, identify at least one parameter from the group of adaptable parameters based on a projected effect of the modification on a quality parameter of the magnetic resonance measurement, and adapt the identified at least one parameter in accordance with the calculated modification suggestion.

17. A magnetic resonance installation comprising the apparatus of claim 16.

18. The magnetic resonance installation of claim 17, wherein the apparatus is integrated in the magnetic resonance installation.

19. The magnetic resonance installation of claim 17, wherein the apparatus is arranged remotely or isolated from the magnetic resonance installation.

20. A non-transitory computer-readable data medium storing program code of a computer program, to perform the method of claim 1 when the computer program is executed on a computer of a magnetic resonance installation including the computer.

* * * * *